United States Patent [19]

Yang

[11] Patent Number: 5,264,386
[45] Date of Patent: Nov. 23, 1993

[54] READ ONLY MEMORY MANUFACTURING METHOD

[75] Inventor: Ming T. Yang, Hsin Chu City, Taiwan

[73] Assignee: United Microelectronics Corporation, Hsinchu, Taiwan

[21] Appl. No.: 941,807

[22] Filed: Sep. 8, 1992

[51] Int. Cl.⁵ .......................... H01L 21/70
[52] U.S. Cl. ........................ 437/52; 437/45; 437/48
[58] Field of Search ............ 437/45, 48, 52, 228, 437/235, 28, 29

[56] References Cited

U.S. PATENT DOCUMENTS

| | | | |
|---|---|---|---|
| 4,775,550 | 10/1988 | Chu et al. | 437/228 |
| 4,826,786 | 5/1989 | Merenda | 437/195 |
| 4,894,351 | 1/1990 | Batty | 437/190 |
| 4,986,878 | 1/1991 | Malazgirt et al. | 156/643 |
| 5,002,896 | 3/1991 | Naruke | 437/48 |

FOREIGN PATENT DOCUMENTS 0166763  7/1991  Japan ................ 437/52

Primary Examiner—Tom Thomas
Attorney, Agent, or Firm—George O. Saile

[57] ABSTRACT

A method for making a Read Only Memory having spaced source and drain regions in a substrate and a plurality of closely spaced gate electrodes on the surface, spanning the distance between the source and drain. The method features the fabrication of a double density polysilicon word line structure for a given integrated circuit chip area. The method also features the formation of a first and a second code ion implant which uses self-alignment techniques, rather than using lithography techniques.

11 Claims, 7 Drawing Sheets

READ ONLY MEMORY MANUFACTURING METHOD

BACKGROUND OF THE INVENTION

(1) Field of the Invention

This invention relates to Read Only Memory manufacturing techniques more particularly to a method of producing high density Read Only Memory devices by making self-aligned and closely spaced polysilicon lines.

(2) Description of Related Art

Semiconductor memories have been one of the fastest growing segments of the semiconductor industry. As the density of the memory cells has increased, the cost of the devices has decreased, resulting in more and more applications.

As each new generation of memories has evolved, the chip density has roughly quadrupled. This density increase has been achieved by new and innovative cell design. Current techniques are crowding the capabilities of optical technology for alignment of masks, exposure of photoresist with light limits, and the effects of substrate surface planarity on resist exposure.

The double polysilicon read only memory (ROM) process is a known process in the art, such as shown by Y. Naruke in U.S. Pat. No. 5,002,896. However, the use of spin-on-glass in such processes is unknown.

Researchers in the integrated circuit field do use spin-on-glass plus etchback processes as shown by Chu et al U.S. Pat. No. 4,775,550; Merenda et al U.S. Pat. No. 4,826,786; Batty U.S. Pat. No. 4,894,351; and Malazgirt et al U.S. Pat. No. 4,986,878.

SUMMARY OF THE INVENTION

It is an object of this invention to provide an improved method for producing Read Only Memory devices having greater integration density.

Yet another object of this invention is to provide an improved method for producing Read Only Memory devices of great density, wherein the code implantation is not limited by lithographic resolution and/or alignment accuracy.

The method of the invention produces a Read Only Memory device with cells having spaced source and drain regions in a semiconductor substrate and a plurality of closely spaced gate electrodes on the surface, spanning the distance between the source and drain. The method steps include first depositing a relatively thick oxide layer on the substrate and patterning it to provide a plurality of spaced openings between two polysilicon electrode lines where the openings define a first layer of electrode areas. Then a gate oxide is formed in the openings. A photoresist layer is deposited and patterned to selectively cover the openings and define a code implantation of the first layer of gate electrodes. An impurity is implanted in the unmasked openings, the photoresist is removed and a first relatively thick blanket layer of polycrystalline silicon is deposited, resulting in depressions over the openings in the oxide layer. Glass is deposited in the depressions using spin-on-techniques. The exposed areas of the first polycrystalline silicon layer are etched, thereby producing a first layer of gate electrodes beneath the glass areas, the glass areas are removed. The oxide layer is removed and an insulating layer is formed over the first polycrystalline layer areas. A photoresist layer is deposited, developed and patterned to selectively cover the openings between the first layer of gate electrodes that defines a code implantation for the second layer of gate electrodes. An impurity is implanted through the unmasked openings. A second blanket polycrystalline silicon layer is deposited. A glass layer is deposited in the depressions using spin-on-techniques. The exposed areas of the second polycrystalline silicon layer are etched, leaving areas which constitute a second layer of gate electrodes. An insulating layer is formed over the gate electrodes. Finally a metallurgy system is deposited and patterned to operationally interconnect the first and second layer electrodes and source and drain regions.

BRIEF DESCRIPTION OF THE DRAWINGS

The accompanying drawings, which are incorporated in and constitute a part of the specification, illustrate a preferred embodiment of the invention, and together with the objects and general description given above, and the detailed description of the preferred embodiment given below, serve to explain the principles of this invention.

FIGS. 13 and 14 are taken on lines 13—13 and 14—14 on FIG. 11 respectively.

DESCRIPTION OF THE PREFERRED EMBODIMENTS

Figure 1:
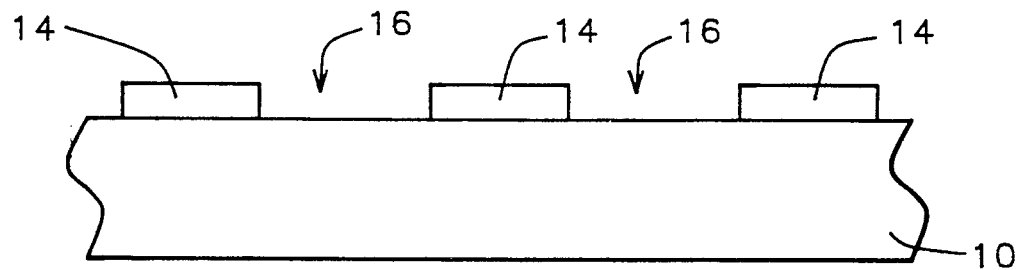
FIGS. 1 through 8, and 12 through 14, schematically illustrate a series of cross-sectional representations that illustrate the process steps of a preferred embodiment of the method of the invention for forming closely spaced polysilicon conductor lines of a Read Only Memory device, and the interconnection metallurgy.
Figure 2:
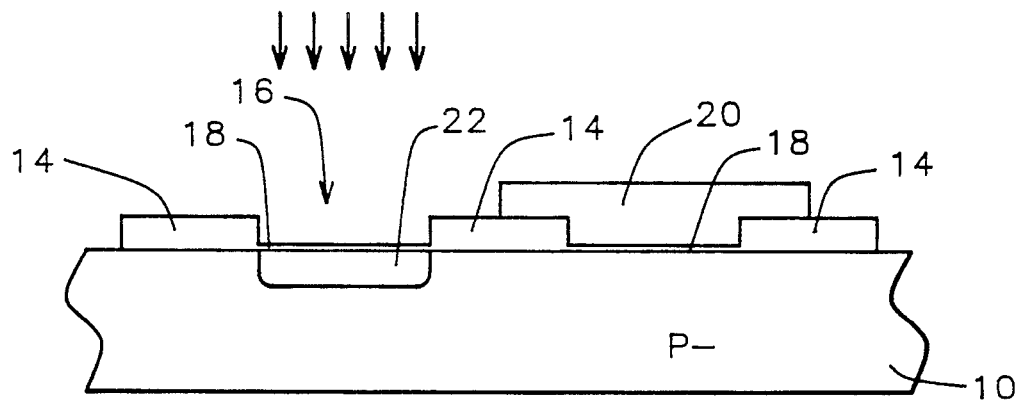
Figure 3:
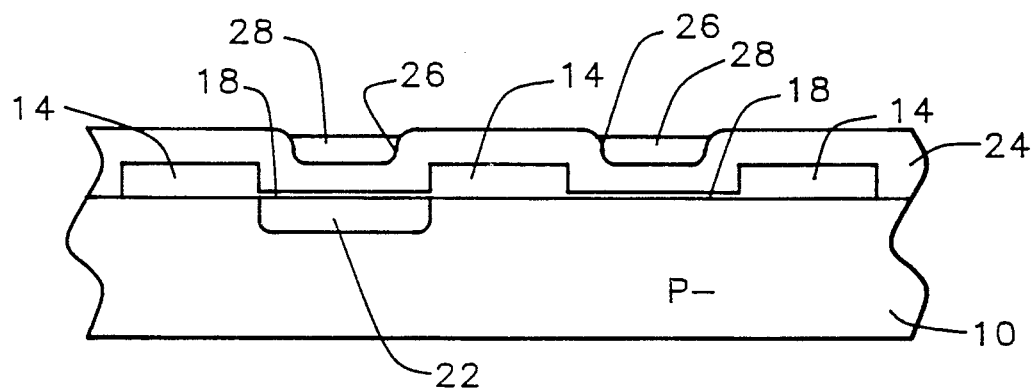

Referring now to the drawing, more particularly to FIG. 1, there is illustrated a semiconductor substrate 10, preferably of monocrystalline silicon doped with a first type impurity. The substrate has spaced source and drain regions, (not shown). The source and drain regions in a Read Only Memory device, constitute bit lines, 12 shown in the overall top view FIG. 11. The substrate 10 preferably has an embodied therein a P type impurity, typically boron of a concentration of between about 1E14 to 5E14 atoms/cm$^3$. The source and drain regions, that is bit lines 12, are formed of regions doped with an opposite N type impurity, typically arsenic with a concentration of between about 5E 18 to 5E21 atoms/cm$^3$. The fabrication of the bit lines will not be described, since it is well known in the art. A thick oxide layer 14 is deposited on the surface of substrate 10 and patterned by conventional photolithographic and etching techniques to provide openings 16 between the source and drain regions that define a first layer of gate electrode area. A thin gate oxide layer 18 is formed on the surface of substrate 10 in openings 16 as shown in FIG. 3. The layer 18 preferably has a thickness of between about 100 to 300 Angstroms and is formed by thermal oxidation or chemical vapor deposition silicon oxide. A photoresist layer 20 is deposited on the substrate and patterned to selectively cover openings 16. The uncovered openings define the desired code implantation of the first layer of gate electrodes. The resist pattern does not require a precise alignment, since the openings in layer 14 act as the implant mask. A suitable impurity is then introduced into the substrate 10 through the unmasked opening 16, resulting in regions 22 as shown in FIG. 2. The impurity introduced by ion implantation techniques can be any suitable impurity of a type opposite to the background impurity in substrate 10. The impurity is preferably boron and is introduced by ion implantation using power of between about 10 to 100 KEV and between about 1E12 to 1E14 atoms/cm$_2$. The silicon oxide layer 18 can then be formed by thermal oxidation or chemical vapor deposition methods.

As shown in FIG. 3, after the photoresist layer 20 is removed, a first polycrystalline silicon layer 24 is deposited. The layer 24 is deposited using well known techniques to a thickness in the range of about 1000 to 6000 Angstroms, preferably on the order of 2000 to 4000 Angstroms. As shown, the layer 24 conforms to the surface of layer 14, resulting in depressions 26, where the layer drops down into opening 16.

Spin-on-glass 28 is then deposited in the depressions 26, using spin-on techniques. A single or even a double coating of a siloxane, such as Allied Signal 211 is applied. Alternatively, a silicate type spin-on-glass coating could be used. The spin-on-glass material suspended in the vehicle or solvent is deposited onto the semiconductor wafer surface and uniformly spread thereover by the action of spinning the wafer, for example, at 3500 revolutions per minute. The material fills the indentations in the integrated circuit wafer surface, that is planarization.

Most of the vehicle or solvent is then driven off by a low temperature baking step. The wafer is heated to for example 80° C., 150° C., and 250° C. Each heating duration is one to two minutes. The total thickness of the spin-on-glass material is sufficient to cover the depressions and there above. A curing step in a nitrogen atmosphere densifies the spin-on-glass layer by converting the organic material, at least in part to a silicon oxide structure. The curing process typically used a 50 minute stabilization time followed by a 15 minute ramp-up from 370° C. to 425° C. The curing time is about 60 minutes.

The spin-on-glass layer 28 is blanket anisotropically plasma etched back using fluorocarbon gases as are known in the art until the spin-on-glass layer 28 is left only in the depressions as seen in FIG. 3. The selectivity between the spin-on-glass layer 28 and the layer 24 is very good using both etching techniques.

Figure 4:
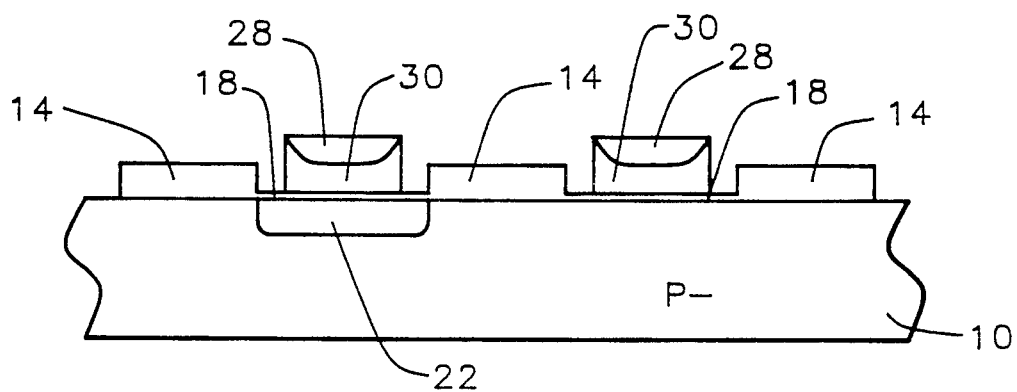

As shown in FIG. 4, the exposed portions of polysilicon layer 24, i.e. the areas not covered by spin-on-glass layer 28, are removed by blanket plasma etching, resulting in the forming of a plurality of gate electrodes, i.e. a first layer of gate electrodes.

Figure 5:
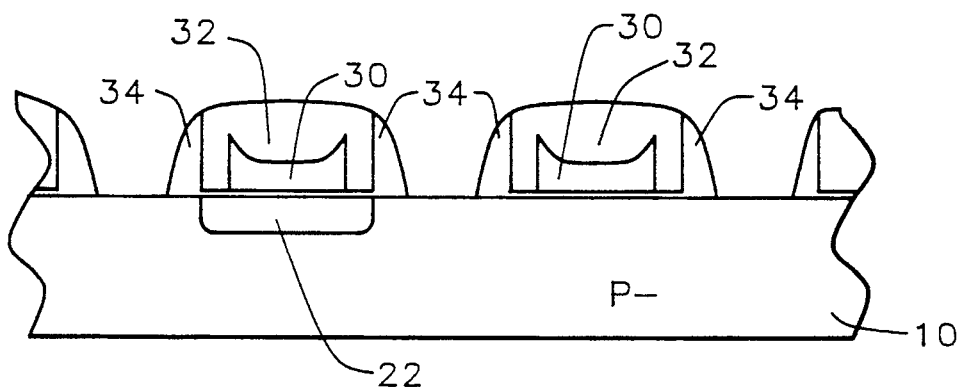

Then, as shown in FIG. 5, the spin-on-glass layer portions 28 are removed, preferably by either a reactive ion etching process with $CHF_3$ or by wet etching using hydrofluoric acid with or without buffering. The layer 14 is also removed during this etching process, and an insulating layer 32 is preferably formed by initially thermally oxidizing the electrode layer 30. Then a thicker layer 34, such as silicon oxide is deposited by chemical vapor deposition techniques, such as atmospheric pressure, low pressure or plasma enhanced chemical vapor deposition. The layer 34 is then etched back to expose the substrate between the electrodes 30, thereby forming spacer walls 34.

Figure 6:
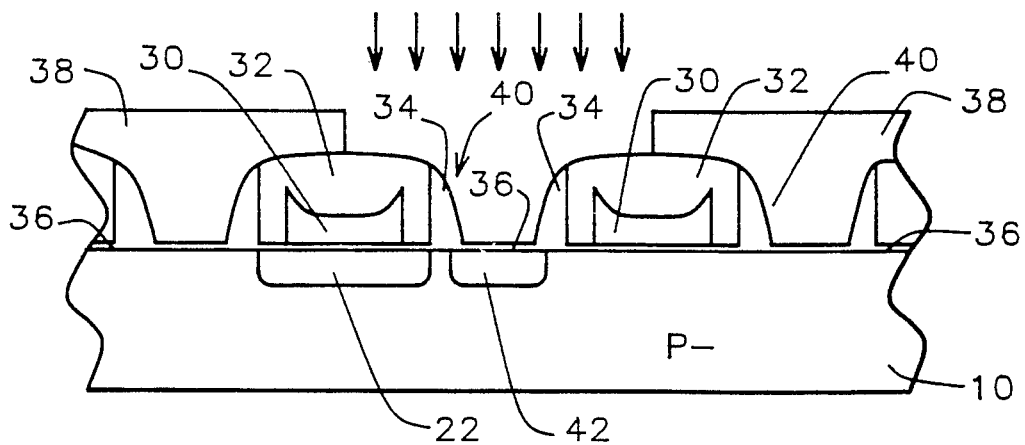

As shown in FIG. 6, a gate oxide is formed on the surface of substrate 10 between gate electrodes 30. A photoresist layer 38 is deposited and patterned to selectively cover the openings 40 between electrodes 30, to define the desired code implant for the second layer of gate electrodes to be formed between the first layer of gate electrodes 30. A suitable impurity is introduced into the substrate 10 through the unmasked openings 40, resulting in regions 42. The introduction of impurities is similar to the introduction of impurities for forming regions 22.

Figure 7:
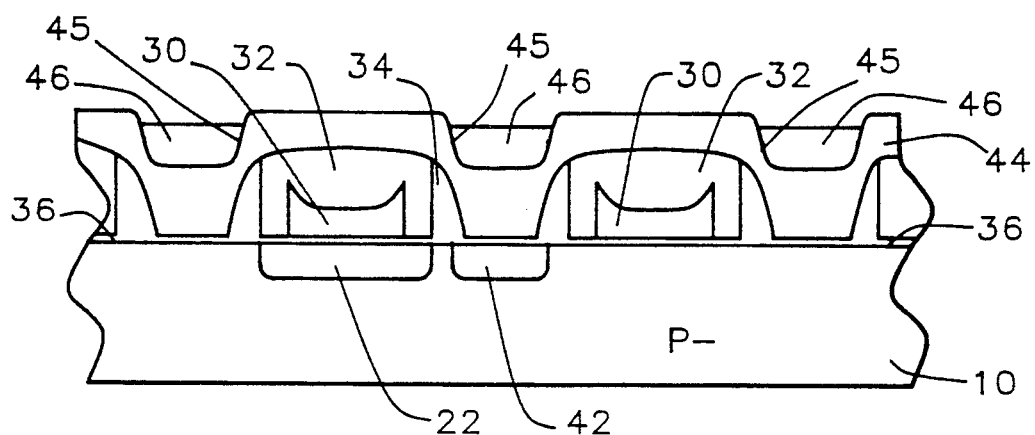
Figure 8:
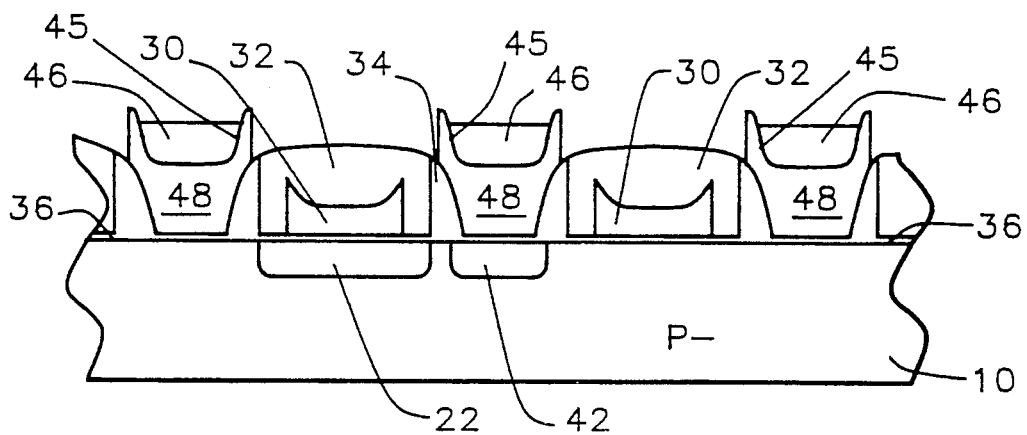
Figure 12:
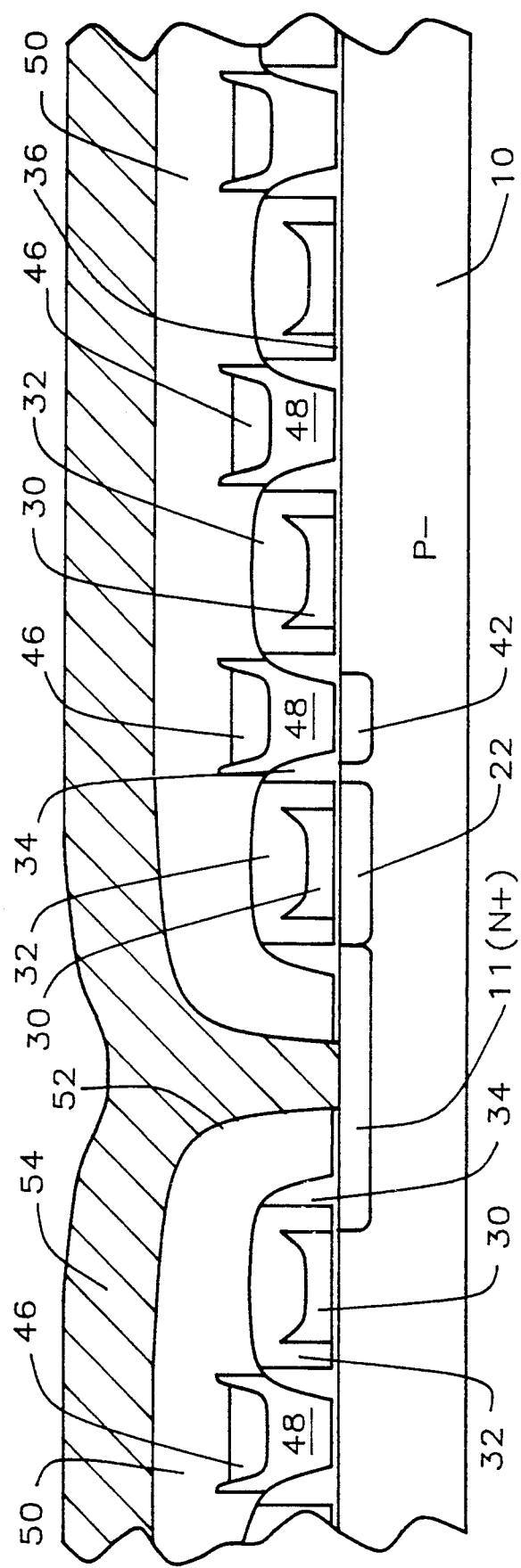

As shown in FIG. 7, after the photoresist layer 38 is removed, a second blanket polycrystalline silicon layer 44 is deposited in the same manner as layer 24, as described previously. Spin-on-glass layer 46 is deposited in depressions 45 in the same manner as described previously in regard to spin-on-glass 28. As shown in FIG. 8, the exposed portions of layer 44, not covered by spin-on-glass layer 46, are blanket plasma etched a described previously with layer 24, leaving gate electrodes 48, i.e. a second layer of gate electrodes positioned between gate electrodes 30. The spin-on-glass layer 46 is removed as described previously with spin-on-glass layers 28, and an insulating layer 50 deposited over the entire surface of the substrate, as shown in FIG. 12. The layer 50 is preferably a layer of borophosphosilicate glass, with an average thickness in the range of about 2000 to 15000 Angstroms, most preferably of the thickness of 4000 to 8000 Angstroms. The layer 50 can be deposited by chemical vapor deposition techniques, such as atmospheric pressure, low pressure or plasma enhanced chemical vapor deposition. The structure is heated from 850° to 950° C. during the deposition of layer 50 which acts to densify and complete the curing of the spin-on-glass layers of the structure.

Figure 13:
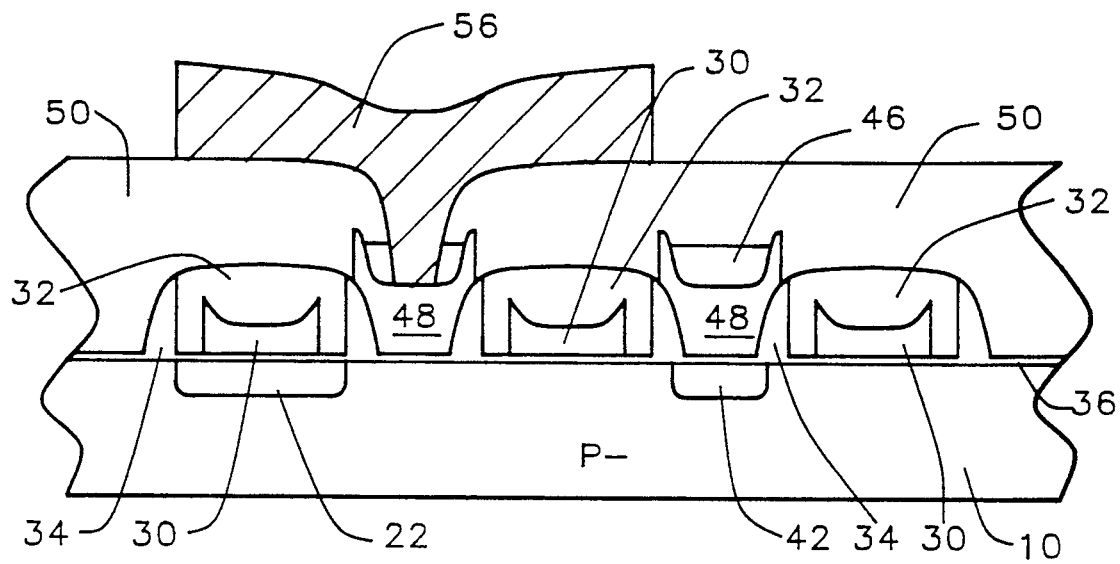
Figure 14:
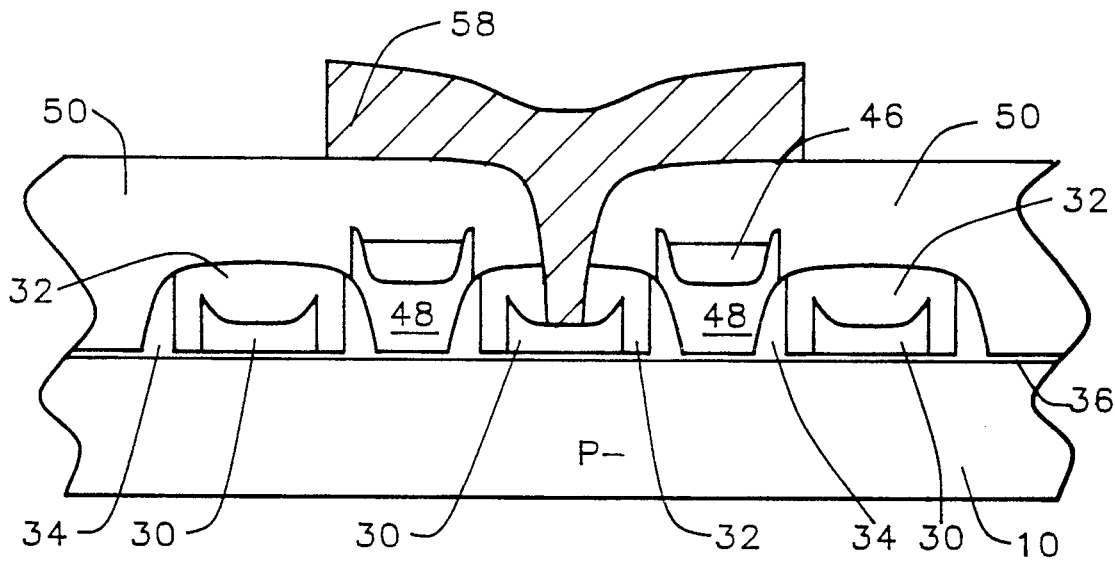

Subsequently, the interconnection metallurgy system is fabricated. A contact opening 52 is made through layer 50 to expose region 11 (BN+), and a metallurgy stripe 54 formed using convention photolithographic and etching techniques. The same technique is used to form a contact 56 to gate electrode 48, which is a bet line, as shown in FIG. 13, and a metallurgy contact 58 made to gate electrode 30, as shown in FIG. 14.

Figure 9:
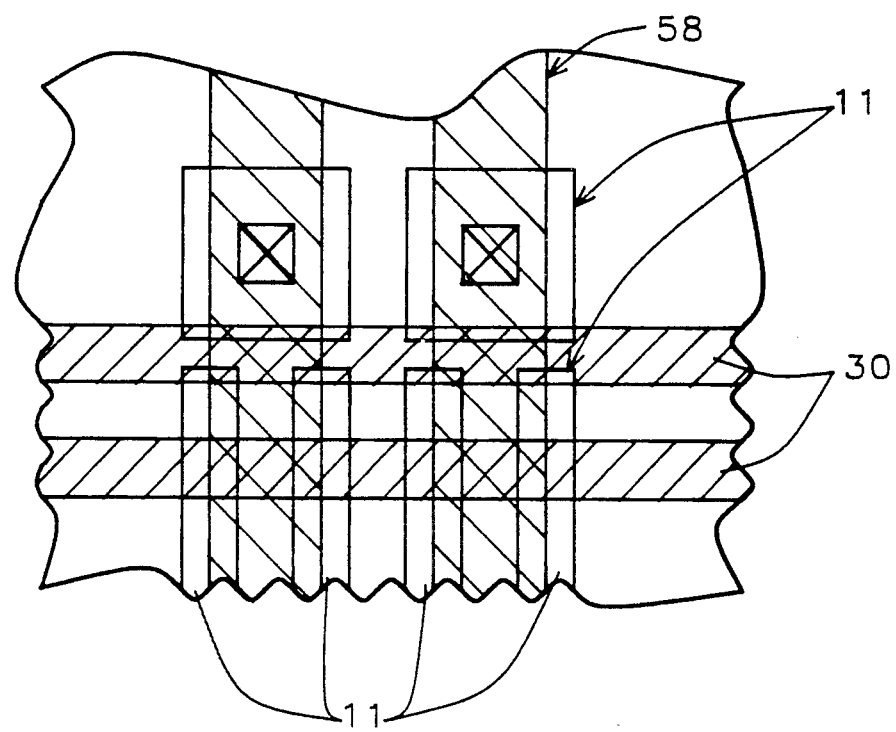
FIGS. 9 through 11 are top plan views, of sections of closely spaced conductor lines of a Read Only Memory produced by the method of the invention.
Figure 10:
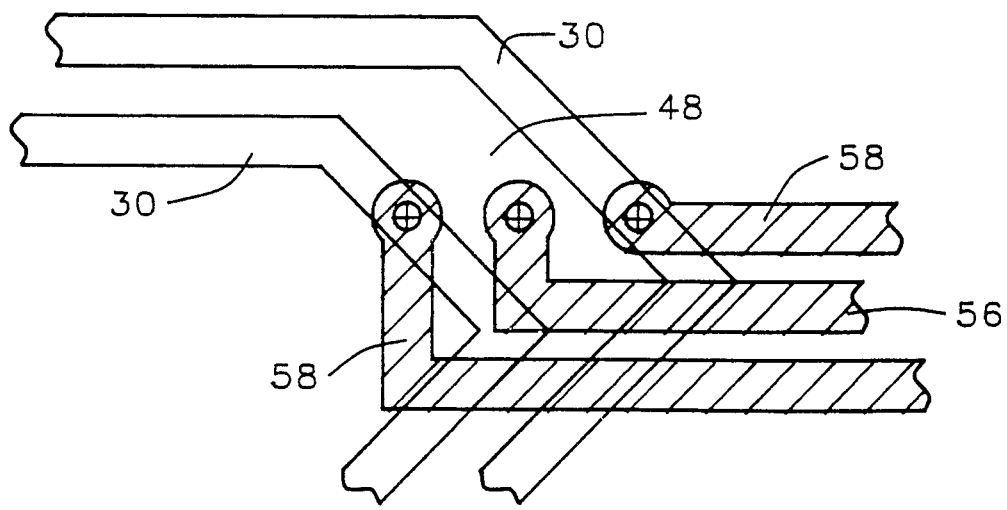
Figure 11:
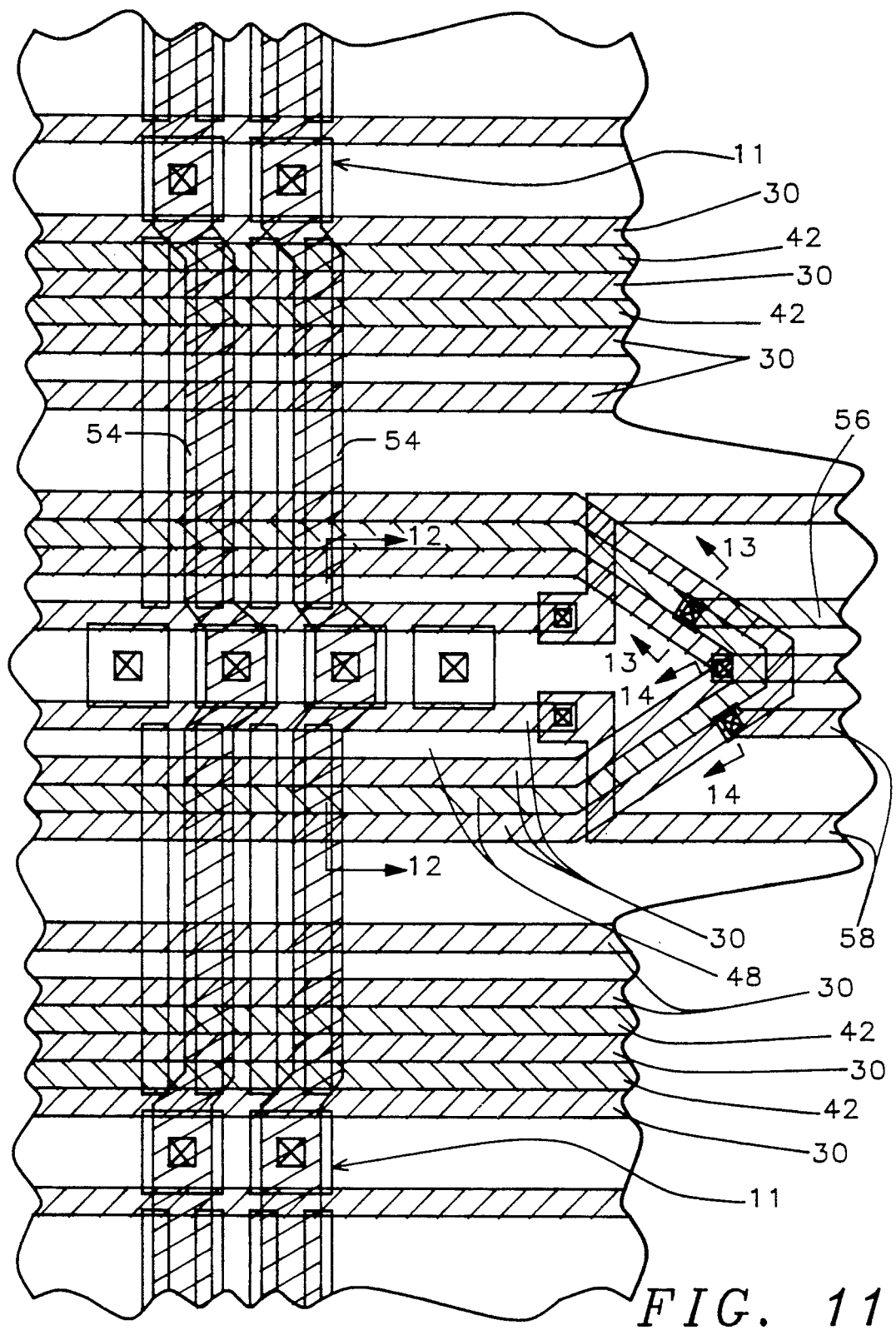

FIG. 11 presents the general layout of the cell structure fabricated by the method of the invention. The various elements have the same numbering as the elements shown in FIG. 1 through 9 and 12 and 14. FIGS. 9 and 10 show portions of the FIG. 11. FIG. 9 at 11 shows the BN+ implanted region or source/drain regions and metal contact 58 thereto.

The advantages of this invention is the ability to produce a double density polysilicon line structure for a given integrated circuit chip area, because of the novel method. This is clearly seen in FIG. 8 where polysilicon I is 30 and polysilicon II is 48. Also, the first code implant regions 22 and second code implant 42 are both deposited with self-alignment.

While the invention has been particularly shown and described with reference to the preferred embodiments thereof, it will be understood by those skilled in the art, that various changes in form and details may be made without departing from the spirit and scope of the invention.

What is claimed is:

1. A method of producing a Read Only Memory device with cell having spaced source and drain regions in a semiconductor substrate and a plurality of closely spaced gate electrodes with surface spanning the distance between the source and drain regions comprising the steps of:

providing a semiconductor substrate of a first conductivity type having spaced source and drain regions of a second conductivity type;

depositing a first relatively thick oxide layer on the substrate and patterning it to provide a plurality of first spaced openings that define a first layer of gate electrode areas;

forming a thin gate oxide layer in the openings;

depositing and patterning a first photoresist layer to selectively cover the first openings and define a code implantation for the first layer of gate electrodes;

implanting a second type impurity through the unmasked openings;

removing the first photoresist layer;

depositing a first relatively thick blanket layer of polycrystalline silicon, having a uniform thickness on the substrate, resulting in first depressions over said first spaced openings of the first oxide layer;

depositing a layer of spin-on-glass in and on said first depressions;

etching back said layer of spin-on-glass to the exposed areas of the first polycrystalline silicon layer and leaving those areas covered by said spin-on-glass in the first depressions, which constitute said first layer of gate electrode areas;

etching and removing said exposed polycrystalline silicon layer and leaving defined first gate electrode areas;

removing said spin-on-glass in the first depressions and the remaining areas of the first relatively thick oxide layer, thereby forming second openings that define a second layer of gate electrode areas;

forming a second insulating layer over the remaining portions of the first polycrystalline silicon layer and the exposed areas of the substrate in said second openings;

depositing and patterning a second photoresist layer to selectively cover the second openings and define a code implantation for the second layer of gate electrodes;

implanting a second type impurity through the unmasked openings;

depositing a second relatively thick blanket layer of polycrystalline silicon, having a uniform thickness on the substrate resulting in second depressions over the second openings;

depositing a layer of spin-on-glass in the second depressions;

etching the exposed areas of the second polycrystalline silicon layer, leaving these areas covered by said spin-on-glass, which constitute said second layer of gate electrode areas;

forming a third insulating layer over the substrate; and forming an interconnecting metallurgy system to the first and second layer electrodes and the source and drain regions to complete said Read Only Memory device.

2. The method of claim 1, wherein the layers of spin-on-glass deposited in the first and second depressions is achieved by spinning on a spin-on-glass solvent suspension on the substrate and baking the spin-on-glass after deposited at a temperature in the range of 180° to 250° C. for a time in the range of one to 5 minutes.

3. The method of claim 1, wherein the second insulating layer over the first polycrystalline silicon layer and second openings is formed by oxidizing the polycrystalline silicon of the first layer of gate electrodes and the substrate surface, depositing a fourth insulating layer over the oxide layer by chemical vapor techniques having a thickness in the range of 1000 to 6000 Angstroms, etching back the fourth insulating layer until the substrate surface is exposed in the second openings, thereby forming spacer layers on the vertical walls of the first layer of gate electrodes, and re-oxidizing the surface of the substrate in said openings to form a gate oxide layer for the second layer of gate electrodes.

4. The method of claim 1, wherein the exposed areas of the first and the second polycrystalline silicon layers is etched with a blanket plasma etch which includes a fluorocarbon element.

5. The method of claim 2 wherein after baking said spin-on-glass, the spin-on-glass is cured at a temperature of between about 400° to 450° C. for between about 20 to 120 minutes.

6. The method of claim 1, wherein the thickness of the first relatively thick oxide layer is in the range of 1000 to 6000 Angstroms.

7. The method of claim 6, wherein the thickness of the first and second polycrystalline silicon layers is in the range of 1000 to 6000 Angstroms.

8. The method of claim 7, wherein the width of the first openings in the first relatively thick oxide layers is in the range of 0.1 to 2 micrometers.

9. The method of claim 8, wherein the first type impurity is P type, and the second type impurity is P type.

10. The method of claim 9, wherein said impurities are boron.

11. The method of claim 10, wherein the third insulating layer over the second layer of gate electrodes is formed by chemical vapor deposition.

* * * * *